United States Patent
Liu et al.

(10) Patent No.: US 10,118,341 B1
(45) Date of Patent: Nov. 6, 2018

(54) CALIBRATION SYSTEM AND METHOD FOR ADDITIVE MANUFACTURING DEVICES

(71) Applicant: Full Spectrum Laser, LLC, Las Vegas, NV (US)

(72) Inventors: Henry Liu, Las Vegas (CA); Mark P. Woodward, Las Vegas, NV (US); Rodney Chang, Las Vegas, NV (US); Nathan Rowe, Las Vegas, NV (US)

(73) Assignee: Full Spectrum Laser, Las Vegas, NV (US)

( * ) Notice: Subject to any disclaimer, the term of this patent is extended or adjusted under 35 U.S.C. 154(b) by 609 days.

(21) Appl. No.: 14/804,204

(22) Filed: Jul. 20, 2015

Related U.S. Application Data

(60) Provisional application No. 62/026,368, filed on Jul. 18, 2014.

(51) Int. Cl.
| | |
|---|---|
| *B29C 64/386* | (2017.01) |
| *G05B 17/02* | (2006.01) |
| *G05B 17/00* | (2006.01) |
| *G01D 18/00* | (2006.01) |
| *B33Y 50/00* | (2015.01) |
| *B33Y 50/02* | (2015.01) |
| *B29C 64/00* | (2017.01) |
| *G05B 19/4099* | (2006.01) |
| *G06F 17/50* | (2006.01) |
| *G01B 11/00* | (2006.01) |

(52) U.S. Cl.
CPC ............ *B29C 64/386* (2017.08); *B29C 64/00* (2017.08); *B33Y 50/00* (2014.12); *B33Y 50/02* (2014.12); *G01D 18/00* (2013.01); *G05B 17/00* (2013.01); *G05B 17/02* (2013.01); *G05B 19/4099* (2013.01); *G01B 11/005* (2013.01); *G06F 17/50* (2013.01)

(58) Field of Classification Search
None
See application file for complete search history.

(56) References Cited

U.S. PATENT DOCUMENTS

| | | | |
|---|---|---|---|
| 2013/0154160 A1* | 6/2013 | Cooper | ................ B29C 64/135 |
| 2015/0178910 A1* | 6/2015 | Lin | ........................... G06T 7/80 |

* cited by examiner

*Primary Examiner* — Qing Yuan Wu
(74) *Attorney, Agent, or Firm* — FisherBroyles, LLP; Rob L. Phillips

(57) ABSTRACT

An additive manufacturing device calibration system and method. In laser control systems, such as the laser control systems used for SL and SLS 3D printers, the laser beam is moved to a location by applying a control value. Often the control value and the location of the laser beam are in different spaces. One calibration system and method involves the input of a number of control values and their corresponding laser beam locations, and the adjusting of the parameters of a mapping function such that the control values generated by applying the mapping function to the input laser beam locations best matches the corresponding input control values.

23 Claims, 4 Drawing Sheets

CALIBRATION SYSTEM AND METHOD FOR ADDITIVE MANUFACTURING DEVICES

CROSS-REFERENCE

This application claims priority to U.S. Patent Application No. 62/026,368 filed Jul. 18, 2014 which is incorporated herein for any and all purposes.

FIELD OF THE INVENTION

The embodiments of the present invention relate to a calibration system and method for use with additive manufacturing (e.g., 3D printing).

BACKGROUND

Additive manufacturing, also known as 3D printing, is any of various processes used to make a three-dimensional object. With 3D printing, additive processes are used, in which successive layers of material are laid down under computer control. A 3D-printed object is typically created through sequential construction of thin layers (i.e., slices) that approximate the object's boundary surfaces. Additive manufacturing technologies include Fused Deposition Modeling (FDM), StereoLithography (SL), layered inkjet deposition, and Selective Laser Sintering (SLS). SL and SLS are examples of laser-based additive manufacturing processes. Laser-based additive manufacturing is comprised of selectively striking regions of the build layer with a laser. The accuracy of this laser placement or focus is important for the creation of accurate 3D models. Lasers on such systems need to be well calibrated to achieve a high degree of accuracy.

It would be advantageous to develop a calibration system and method for facilitating the creation of accurate 3D models. More specifically, a method for creating a mapping which is, among other things, fast, does not require knowledge of the physics of the system and can accommodate variations between 3D printing devices.

SUMMARY

The embodiments of present invention relate to additive manufacturing and a method of calibrating a laser-based additive manufacturing device by collecting a small number of calibration data points. In laser control systems, such as the laser control systems used for SL and SLS 3D printers, the laser beam is moved to a location by applying a control value. Often the control value and the location of the laser beam are in different spaces. For example, the laser beam location may be a point defined by (x, y) coordinates on a build plane while the control value may be a pair of voltages. Thus, in order to move the laser beam to a desired location, a mapping from a desired laser beam location to control value is required. With this mapping, the laser beam can be moved to any desired location by applying the mapping to the desired location to generate the necessary control value.

Other variations, embodiments, and features of the present invention will become evident from the following detailed description, drawings and claims.

DETAILED DESCRIPTION

Figure 1:
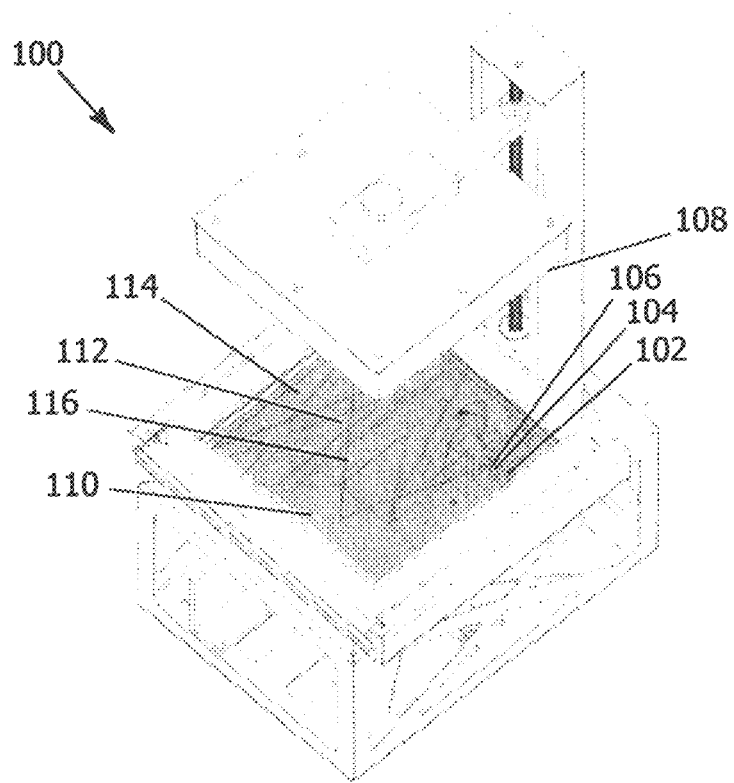
FIG. 1 illustrates a perspective view of a laser-based additive manufacturing device of the type suitable to be calibrated according to the embodiments of the present invention.

For the purposes of promoting an understanding of the principles in accordance with the embodiments of the present invention, reference will now be made to the embodiments illustrated in the drawings and specific language will be used to describe the same. It will nevertheless be understood that no limitation of the scope of the invention is thereby intended. Any alterations and further modifications of the inventive feature illustrated herein, and any additional applications of the principles of the invention as illustrated herein, which would normally occur to one skilled in the relevant art and having possession of this disclosure, are to be considered within the scope of the invention claimed.

Those skilled in the art will recognize that the embodiments of the present invention involve both hardware and software elements which portions are described below in such detail required to construct and operate the calibration system and method according to the embodiments of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.), or an embodiment combining software and hardware. Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), and optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied thereon, for example, in baseband or as part of a carrier wave. Such a propagated signal may take any variety of forms, including, but not limited to, electromagnetic, optical, or any suitable combination thereof. A computer readable signal medium may be any computer readable medium that is not a computer readable storage medium and that can communicate, propagate, or transport a program for use by or in conjunction with an instruction execution system, apparatus, or device.

Program code embodied on a computer readable medium may be transmitted using any appropriate medium, including but not limited to wireless, wireline, optical fiber cable, RF and the like, or any suitable combination of the foregoing.

Computer program code for carrying out operations for aspects of the present invention may be written in any combination of one or more programming languages, including an object oriented programming language such as Java, Smalltalk, C++ or the like or conventional procedural programming languages, such as the "C" programming language, AJAX, PHP, HTML, XHTML, Ruby, CSS or similar programming languages. The programming code may be configured in an application, an operating system, as part of a system firmware, or any suitable combination thereof. The programming code may execute entirely on the user's computer, partly on the user's computer, as a stand-alone software package, partly on the user's computer and partly on a remote computer or entirely on a remote computer or server as in a client/server relationship sometimes known as cloud computing. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

The advantages of the embodiments of the present invention include, without limitation, a way of calibrating a laser-based additive manufacturing device by collecting a small number of calibration data points, without the need to explicitly model the kinematics of the system and variations between systems. The collection and processing of said number of calibration data points is shown to be easily performed.

Referring now to FIG. 1, there is shown a perspective view of a laser-based additive manufacturing device 100 having a laser diode assembly 102, actuated galvanometer mirrors 104 and 106, fixed main mirror 110 and laser beam 112. A build plane, platform or surface 114 is also illustrated. The primary mirror 110 reflects the beam 112 upwards to reach a target or location point 116 on the build surface 114. A processor (not shown) running executable controls, or in communication with remote software, controls the laser-based additive manufacturing device 100. Additional software accessible by said processor may also be used in conjunction with, or instead of, the executable instructions of the processor. An interface (not shown) permits a user to interact and control aspects of the laser-based additive manufacturing device 100.

The laser-based additive manufacturing device 100 of FIG. 1 may use servo-actuated (galvanometer) mirrors 104 and 106 or other types of devices to steer or direct the laser beam 112. The laser-based additive manufacturing device 100 may or may not include one or more fixed mirrors 110 to direct the laser beam 112 for intersection with the build surface 114. The laser beam 112 may be emitted by a laser diode 102 or other radiation source which may be located below, above, or aside the build surface 114. Additionally, the build surface may be non-planar in other embodiments.

Still referring to FIG. 1, in this instance, the laser beam 112 can be made to intersect the build surface 114 at a specific location 116, by applying a specific control value to the galvanometers 104 and 106. In order to apply the appropriate control value to reach the desired location, a mapping between location and control value is needed.

One method for creating the mapping is to directly model the physics which produce the laser beam location from the control value. Such a method is time consuming and requires expert knowledge. Moreover, in practice, there are optical, mechanical, and electrical imperfections in any laser-based additive manufacturing device, resulting in differences between machines. Since the imperfections for a given machine are difficult, if not impossible, to predict, a mapping created by direct modeling will contain inherent imprecision and inaccuracy.

The embodiments of the present invention involve building a mapping by collecting a set of calibration data points, and fitting the parameters of an unfitted mapping function to the collected calibration data points. Such a process, produces a precise mapping function calibrated to the specific laser-based additive manufacturing device. The resulting mapping automatically includes the physics of the system, and any optical, mechanical and electrical imperfections associated therewith.

While the detailed description focuses on control values being galvanometer voltages, other control values such as laser beam angles may be used with the embodiments of the present invention. Moreover, other laser steering systems (e.g., spinning mirrors) are available and may be used with the embodiments of the present invention. That is, the embodiments of the present contemplate collecting different control values dependent upon the laser steering system used by the additive manufacturing device.

Figure 3:
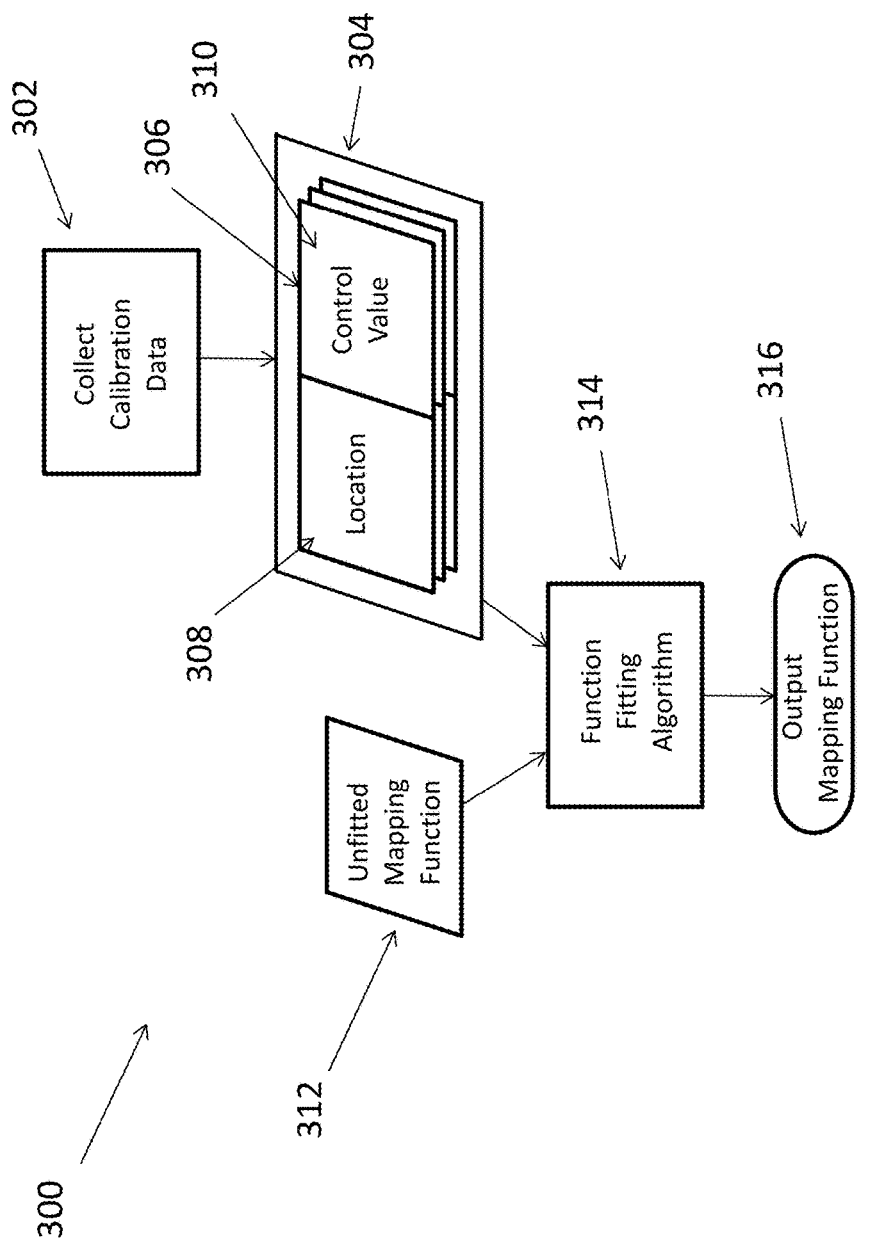
FIG. 3 illustrates a flow chart of a methodology for calibrating a laser-based additive manufacturing device according to the embodiments of the present invention.

Referring now to FIG. 3, there is shown a flow chart algorithm 300 for the creation of a mapping function 316. Through an automated or manual process 302, a set of calibration data points 304 is collected. Each calibration data point 306 consists of a control value 310 and the resulting location 308 of the laser beam. The control values 310 can be selected at random, but, they should be selected such that the resulting locations 308 cover all important regions of the build surface 114.

Still referring to FIG. 3, an unfitted mapping function 312, whose parameters have not been set, is chosen and passed to a function fitting algorithm 314, along with the calibration data set 304 comprising locations and control values. The function fitting algorithm 314 adjusts the parameters of the unfitted mapping function 312 until the error between the mapped control value and the measured control value 310 is minimized for the calibration data set. A specific example is given below. The result is a mapping function 316 that can accurately reproduce the control values 310 in the calibration data set 304.

Figure 2:
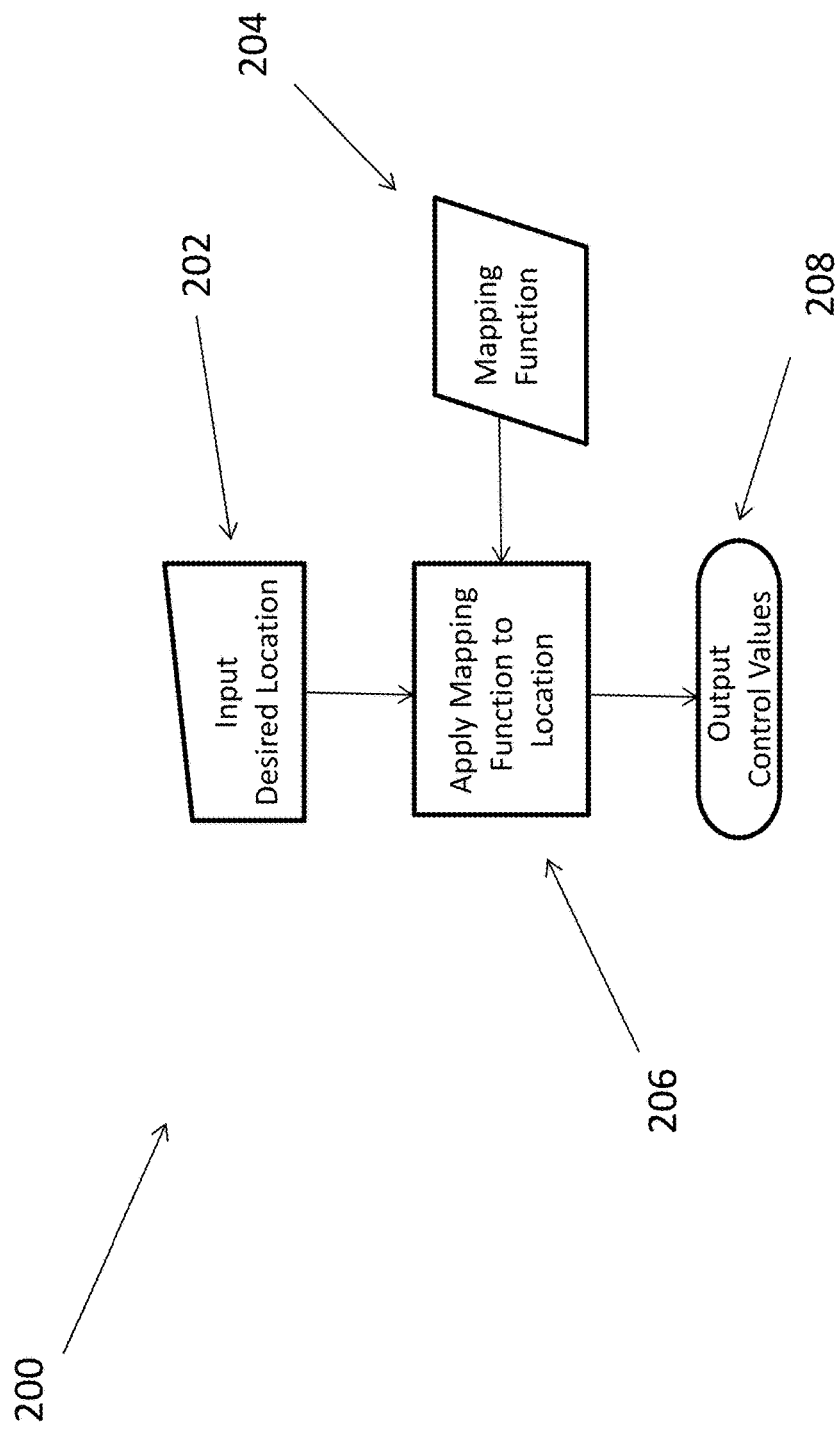
FIG. 2 illustrates a flow chart of a methodology of generating the control value to move a laser to its target position according to the embodiments of the present invention.

Referring now to FIG. 2, there is shown a flow chart 200 for making use of the calibrated mapping function 204. In 206, the mapping function 204 is applied to a desired location 202, resulting in a control value 208 (e.g., voltages). The control value can then be applied to the system to move the laser to the desired location 202.

One embodiment of the present invention is set forth in Table 1 below.

TABLE 1

| Machine | SL |
| --- | --- |
| Location | A point on the build plane (x, y) |
| Control Value | Two voltages, one for each of two mirror galvanometers |
| Data Collection | Manual guidance, via a paper placed on the build plane, depicting a grid of dots and arrows therebetween to guide the user. |
| Mapping Function | Two $2^{nd}$ degree polynomials |
| Function Fitting Algorithm | Linear Regression |

Referring again to FIG. 1, there is shown an example of a SL laser-based additive manufacturing device 100. The location 116 of the laser beam 112 on the build surface 114, can be represented as an (x, y) pair. Before reaching the build surface 114, the laser beam 112 bounces or reflects off of the mirrors on the two mirror galvanometers 104 and 106. The location 116 of the laser beam 112 on the build surface 114 is dictated by the angle of the mirrors on the galvanometers 104 and 106. The angle of the mirrors on the galvanometers is controlled by an applied voltage. Thus, the control value is two voltage values, one for each of the mirror galvanometers 104 and 106.

Figure 4:
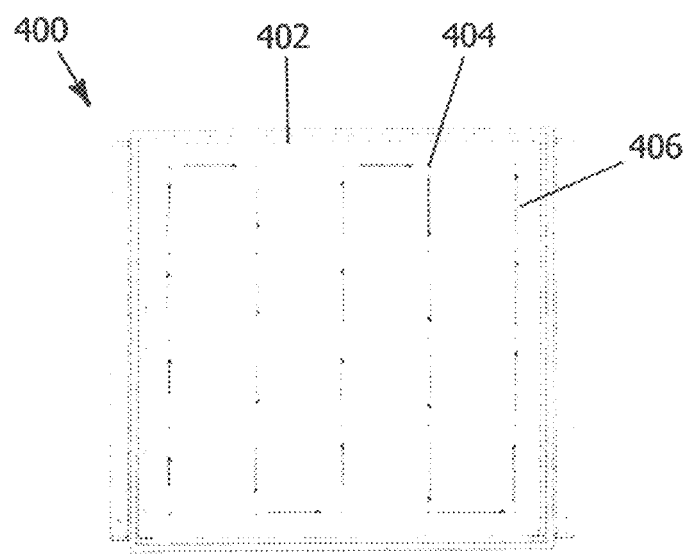
FIG. 4 illustrates a top view of the build area of a laser-based additive manufacturing device with a guide sheet placed thereon according to the embodiments of the present invention.

Referring now to FIG. 4, there is shown a top view of an exemplary SL build surface 400, with a calibration data collection sheet/substrate 402 placed thereon. The calibration data collection sheet 402 includes numerous dots or marks 404 as well as guiding arrows 406. The calibration data collection sheet 402 is placed on the build surface 400 to aid the user in the collection of calibration data points. For the first dot on the paper, the human changes the control value, via a touch screen interface or similar device, until the laser beam is directed to the first dot. The user then triggers the capture of that calibration data point, via a touch screen interface. Since the system knows the location that corresponds to the first dot on the calibration data collection sheet 402, and it knows the current control value, the system is able to record the location and control value into a calibration data point (i.e., location (x, y) and voltages). The user then repeats this for each dot on the calibration collection data sheet/substrate 402, following the arrows 406. This process results in the calibration data set.

In an automated system, a series of photosensors (acting as the marks) are positioned on the build surface 400. The system automatically guides the laser to the photosensors to determine the control values associated therewith. The location of the marks may be randomly distributed or based on a pre-established model related to device type, etc. The location of the marks must be known to the machine.

The mapping function takes a location, in this case the x and y location on the build surface, and outputs a control value, in this case, a voltage for each of the mirror galvanometers. In this instance, the mapping function is divided into two functions, $V_A(x, y)$ and $V_B(x, y)$, one for the voltage for galvanometer A and one for the voltage for galvanometer B. Each function has independent parameters, "a" and "b", respectively. A mapping function with multiple outputs does not need to be decomposed in this manner but can be a single function with a multi-dimensional output. In this embodiment, $V_A(x, y)$ and $V_B(x, y)$ are chosen to each be second order polynomials:

$$V_A(x,y) = a_0 + a_1 x + a_2 y + a_3 xy + a_4 xx + a_5 yy$$

$$V_B(x,y) = b_0 + b_1 x + b_2 y + b_3 xy + b_4 xx + b_5 yy$$

For the calibration data set, let $p^i$ be the location on the build plane of calibration data point i. Further, let $p_x^i$ be the x component of the location of the ith calibration data point, and $p_y^i$ be the y component of the location of the ith calibration data point. Let $v^i$ be the control value voltages of calibration data point i. Further, let $v_a^i$ be the voltage for galvanometer A for data point i, and let $v_b^i$ be the voltage value for galvanometer B for data point i. Calibration data point i may now be represented as the pair $(p^i, v^i)$. Let n be the number of calibration data points in the calibration data set.

For this embodiment, the chosen function fitting algorithm is linear regression. Those skilled in the art will recognize that other function fitting algorithm may be used with polynomial functions and other functions (e.g., backpropagation for neutral networks) used within the embodiments of the present invention. The objective is to choose $a_j$ such that the predicted $V_A(p_x^i, p_y^i)$ is close to the measured $v_a^i$ for all i. Similarly, the objective is to choose $b_j$ such that the predicted $V_B(p_x^i, p_y^i)$ is close to the measured $v_b^i$ for all i. Specifically, linear regression minimizes:

$$\sum_{i=1}^{n} (V_A(p_x^i, p_y^i) - v_a^i)^2$$

and $$\sum_{i=1}^{n} (V_B(p_x^i, p_y^i) - v_b^i)^2$$

There are many freely available implementations of linear regression algorithms. For example, the "\" operator in Matlab, or the dgesv( ) function in the LAPACK library for C/C++. Nearly all of these libraries require the data to be provided in a similar format. Specifically, they require a matrix X and a vector z. For this embodiment, the matrix X is the same for the $a_j$ linear regression and the $b_j$ linear regression, but the vector z is different. Let $z_a$ be the z vector for the $a_j$ linear regression and let $z_b$ be the z vector for the $b_j$ linear regression. Here X, $z_a$, and $z_b$ are defined as:

$$X = \begin{bmatrix} 1 & p_x^1 & p_y^1 & p_x^1 p_y^1 & p_x^1 p_x^1 & p_y^1 p_y^1 \\ 1 & p_x^2 & p_y^2 & p_x^2 p_y^2 & p_x^2 p_x^2 & p_y^2 p_y^2 \\ & & & \cdots & & \\ 1 & p_x^n & p_y^n & p_x^n p_y^n & p_x^n p_x^n & p_y^n p_y^n \end{bmatrix}$$

$$z_a = [v_a^1, v_a^2, \ldots, v_a^n]^T$$

$$z_b = [v_b^1, v_b^2, \ldots, v_b^n]^T$$

Passing X and $z_a$ to a linear regression solver gives the $a_j$ parameters for the $V_A(x, y)$ mapping function. Passing X and $z_b$ to a linear regression solver gives the $b_j$ parameters for the $V_B(x, y)$ mapping function.

With the parameters of $V_A(x,y)$ and $V_B(x,y)$ fit to the calibration data set, the result is a precise mapping function calibrated for a specific 3D printing device.

While the foregoing written description of the embodiments of the present invention enable one of ordinary skill to make and use what is considered presently to be the best mode thereof, those of ordinary skill will understand and appreciate the existence of variations, combinations, and equivalents of the specific embodiment, method, and examples herein. The invention herein should therefore not be limited by the above-described embodiments, methods, and examples, but by all embodiments and methods within the scope and spirit of the invention as claimed.

We claim:

1. An additive manufacturing device calibration method comprising:
    (i) collecting a number of laser locations on a build surface of said additive manufacturing device and corresponding control values of said laser locations necessary to direct a laser to said laser locations;
    (ii) applying a function fitting algorithm to an unfitted mapping function utilizing said laser locations and said corresponding control values to generate a calibration data set of laser locations and corresponding control values wherein said calibration data set permits control values to be generated from other laser locations not yet collected; and
    (iii) moving a laser to a desired laser location by applying mapping to said desired laser location to generate a necessary control value.

2. The additive manufacturing device calibration method of claim 1 further comprising automatically collecting said laser locations on said build surface of said additive manufacturing device and corresponding control values of said laser locations.

3. The additive manufacturing device calibration method of claim 2 further comprising utilizing photosensors positioned on said build surface.

4. The additive manufacturing device calibration method of claim 1 further comprising randomly and automatically collecting said laser locations on said build surface of said additive manufacturing device and corresponding control values of said laser locations.

5. The additive manufacturing device calibration method of claim 4 further comprising utilizing photosensors positioned on said build surface.

6. The additive manufacturing device calibration method of claim 1 further comprising utilizing a manual system for collecting said laser locations on said build surface of said additive manufacturing device and corresponding control values of said laser locations.

7. The additive manufacturing device calibration method of claim 6 further comprising utilizing a substrate depicting said laser locations on said build surface wherein said substrate is dimensioned to at least partially cover said build surface.

8. The additive manufacturing device calibration method of claim 1 further comprising utilizing a $2^{nd}$ order polynomial as said unfitted mapping function.

9. The additive manufacturing device calibration method of claim 1 further comprising utilizing a linear regression as said function fitting algorithm.

10. The additive manufacturing device calibration method of claim 1 further comprising collecting said control values in the form of galvanometer voltages.

11. An additive manufacturing device system comprising:
    a laser;
    a laser steering system for controlling a direction of focus of said laser;
    a build surface;
    an interface; and
    computer instructions configured to:
        (i) collect a number of laser locations on said build surface and corresponding control values of said laser locations necessary to direct said laser to said laser locations; and
        (ii) apply a function fitting algorithm to an unfitted mapping function utilizing said laser locations and said corresponding control values to generate a calibration data set of laser locations and corresponding control values wherein said calibration data set permits control values to be determined from other laser locations not yet collected.

12. The additive manufacturing device system of claim 11 wherein said computer instructions are further configured to: automatically collect said laser locations on said build surface and said corresponding control values.

13. The additive manufacturing device system of claim 11 further comprising photosensors configured to position on said build surface.

14. The additive manufacturing device system of claim 11 further comprising a substrate depicting laser locations on said build surface wherein said substrate is dimensioned to at least partially cover said build surface.

15. The additive manufacturing device system of claim 11 wherein said computer instructions are further configured to: utilize a $2^{nd}$ order polynomial as said unfitted mapping function.

16. The additive manufacturing device system of claim 11 wherein said computer instructions are further configured to: apply a linear regression as said function fitting algorithm.

17. The additive manufacturing device system of claim 11 wherein said laser steering system includes galvanometers and said collected and yet to be collected control values are based on galvanometer voltages.

18. An additive manufacturing device system comprising:
    a laser;
    a laser steering system for controlling a direction of focus of said laser;
    a build surface;

a substrate depicting multiple marks representing laser locations on said build surface;

an interface allowing a user to manually direct the laser to said marks on said substrate as said substrate rests on said build surface; and computer instructions configured to:
- (i) collect control values as said laser is directed at each of said marks; and
- (ii) apply a function fitting algorithm to an unfitted mapping function utilizing said laser locations, associated with each of said marks, and said corresponding control values to generate a calibration data set of laser locations and corresponding control values wherein said calibration data set permits control values to be determined for other laser locations not identified by a mark on said substrate.

19. The additive manufacturing device system of claim 18 wherein said substrate further depicts guide arrows between marks thereon.

20. The additive manufacturing device system of claim 18 wherein said substrate is dimensioned to at least partially cover said build surface.

21. The additive manufacturing device system of claim 18 wherein said computer instructions are further configured to: utilize a $2^{nd}$ order polynomial as said unfitted mapping function.

22. The additive manufacturing device system of claim 18 wherein said computer instructions are further configured to: apply a linear regression as said function fitting algorithm.

23. An additive manufacturing device system comprising:

a laser;

a laser steering system for controlling a direction of focus of said laser;

a build surface;

a series of photosensors for use on said build surface;

an interface; and computer instructions configured to:
- (i) collect control values as said laser is directed automatically at each of said photosensors; and
- (ii) apply a function fitting algorithm to an unfitted mapping function utilizing laser locations associated with each of said photosensors and said corresponding control values to generate a calibration data set of laser locations and corresponding control values wherein said calibration data set permits control values to be determined for other laser locations not identified by a photosensor on said build surface.

* * * * *